(12) United States Patent
Nagarajan et al.

(10) Patent No.: US 6,441,499 B1
(45) Date of Patent: Aug. 27, 2002

(54) THIN FORM FACTOR FLIP CHIP BALL GRID ARRAY

(75) Inventors: Kumar Nagarajan, San Jose; Sarathy Rajagopalan, Fremont, both of CA (US)

(73) Assignee: LSI Logic Corporation, Milpitas, CA (US)

(*) Notice: Subject to any disclaimer, the term of this patent is extended or adjusted under 35 U.S.C. 154(b) by 0 days.

(21) Appl. No.: 09/651,308

(22) Filed: Aug. 30, 2000

(51) Int. Cl.⁷ .............................................. H01L 23/48
(52) U.S. Cl. .................. 257/780; 257/680; 257/681; 257/701
(58) Field of Search ................ 257/747, 780, 257/707, 680, 681, 702, 738; 438/108, 118, 613

(56) References Cited

U.S. PATENT DOCUMENTS

| | | | | |
|---|---|---|---|---|
| 5,308,980 A | * | 5/1994 | Barton | 250/338.4 |
| 5,610,442 A | * | 3/1997 | Schneider | 257/787 |
| 5,956,576 A | * | 9/1999 | Toy | 438/125 |
| 6,163,462 A | * | 12/2000 | Buck | 361/767 |
| 6,204,090 B1 | | 3/2001 | Boyle et al. | |
| 6,279,815 B1 | * | 8/2001 | Correia | 228/180.21 |
| 6,281,452 B1 | * | 8/2001 | Prasad | 174/262 |
| 6,291,884 B1 | * | 9/2001 | Glenn | 257/747 |
| 6,303,977 B1 | * | 10/2001 | Schroen | 257/635 |

FOREIGN PATENT DOCUMENTS

JP  405121587 A  *  5/1993

* cited by examiner

*Primary Examiner*—Olik Chaudhuri
*Assistant Examiner*—Nathan W. Ha
(74) *Attorney, Agent, or Firm*—Fitch, Even, Tabin & Flannery

(57) ABSTRACT

A method for making a flip chip ball grid array (BGA) package includes the step of thinning a die for matching a composite coefficient of thermal expansion to that of a second level board.

7 Claims, 2 Drawing Sheets

THIN FORM FACTOR FLIP CHIP BALL GRID ARRAY

BACKGROUND OF THE INVENTION

The present invention relates generally to package construction of integrated circuits. More specifically, but without limitation thereto, the present invention relates to the construction of an integrated circuit package for a flip chip plastic ball grid array (BGA).

FIG. 1 is a side view diagram of a flip chip ball grid array package 100 of the prior art. Shown are a stiffener 102, a heat spreader 104, a die 106, a laminated substrate 108, wafer bumps 110, an underfill 112, a thermally conductive adhesive 114, solder balls 116, a stiffener adhesive 118, and a second level board 120.

The stiffener 102 and the heat spreader 104 typically have the same area as the flip chip plastic ball grid array package 100. The die 106 has a standard thickness of 725 microns and is electrically connected to the substrate 108 by the wafer bumps 110, which are typically made of a eutectic solder. The spaces between the wafer bumps 110 and the die 106 are underfilled with the underfill 112.

The stiffener 102 is typically attached to the substrate 108 and the heatspreader 104 by the stiffener adhesive 118 to protect the ball grid array package 100 from flexure damage. The heatspreader 104 is attached to the stiffener 102 to conduct heat away from the die 106 through the thermally conductive adhesive 114. The flip chip ball grid array package 100 may be mounted on a second level package 120 by the solder balls 116.

Disadvantageously, the composite coefficient of thermal expansion (CTE) of the ball grid array package 100 is lower than the coefficient of thermal expansion of the second level board 120 because the die 106 has a coefficient of thermal expansion that is several times lower than that of the second level board 120. The difference in the coefficients of thermal expansion causes cracking of the solder balls 116 connecting the substrate 108 to the second level board 120 and results in poor second level package reliability. A ball grid array package is needed that can withstand manufacturing temperature cycles without damage to the solder ball interconnects.

SUMMARY OF THE INVENTION

The present invention advantageously addresses the needs above as well as other needs by providing a method and apparatus for a thermally tolerant flip chip ball grid array package.

In one embodiment, the invention may be characterized as a method for making a flip chip ball grid array package that includes the step of thinning a die for matching a composite coefficient of thermal expansion to that of a second level board.

In another embodiment, the invention may be characterized as an apparatus for a flip chip ball grid array package that includes a thin die having a die thickness for matching a composite coefficient of thermal expansion to that of a second level board.

The features and advantages summarized above in addition to other aspects of the present invention will become more apparent from the description, presented in conjunction with the following drawings.

BRIEF DESCRIPTION OF THE DRAWINGS

The above and other aspects, features and advantages of the present invention will be more apparent from the following more specific description thereof, presented in conjunction with the following drawings wherein.

Corresponding reference characters indicate corresponding elements throughout the several views of the drawings.

DETAILED DESCRIPTION OF THE DRAWINGS

The following description is presented to disclose the currently known best mode for making and using the present invention. The scope of the invention is defined by the claims.

Figure 2:
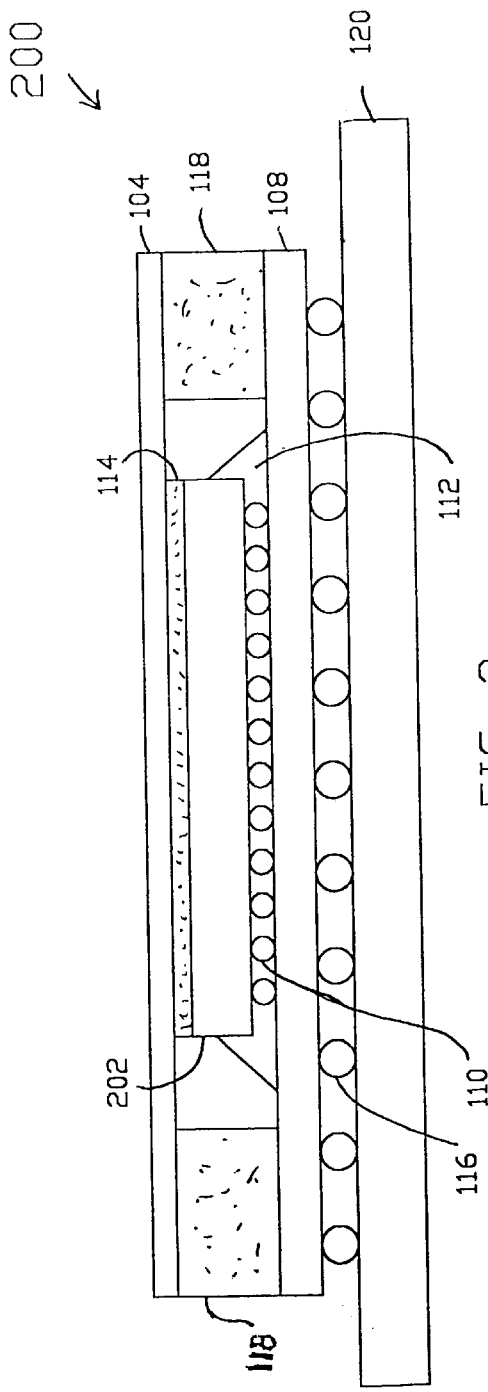
FIG. 2 is a side view diagram of a flip chip ball grid array package according to an embodiment of the present invention.

FIG. 2 is a side view diagram of a flip chip ball grid array (BGA) package 200. Shown are a heatspreader 104, a substrate 108, wafer bumps 110, an underfill 112, a thermally conductive adhesive 114, a stiffener adhesive 118, a second level board 120, and a thin die 202.

The thin die 202 may be made from a standard die by well known techniques such as grinding, chemical etching, and plasma etching. The thin die 202 may also be thinned during the die manufacturing process. The thin die 202 is electrically connected to the substrate 108 by the wafer bumps 110 and is underfilled by the underfill 112, which is typically made of an anhydride based epoxy adhesive having 50 to 65 percent silica fillers. The underfill 112 has a high tensile modulus that stiffens the package.

The heatspreader 104 is attached to the thin die 202 by the thermal adhesive 114 and to the substrate 108 by the stiffener adhesive 118. The stiffener adhesive 118 may be, for example, bisphenol. Bisphenol is an epoxy sparsely filled with silica spacers. The heatspreader 104 is preferably made of a good heat conductor such as copper. The thermal adhesive 114 may be, for example, Thermost TC 330.

Figure 1:
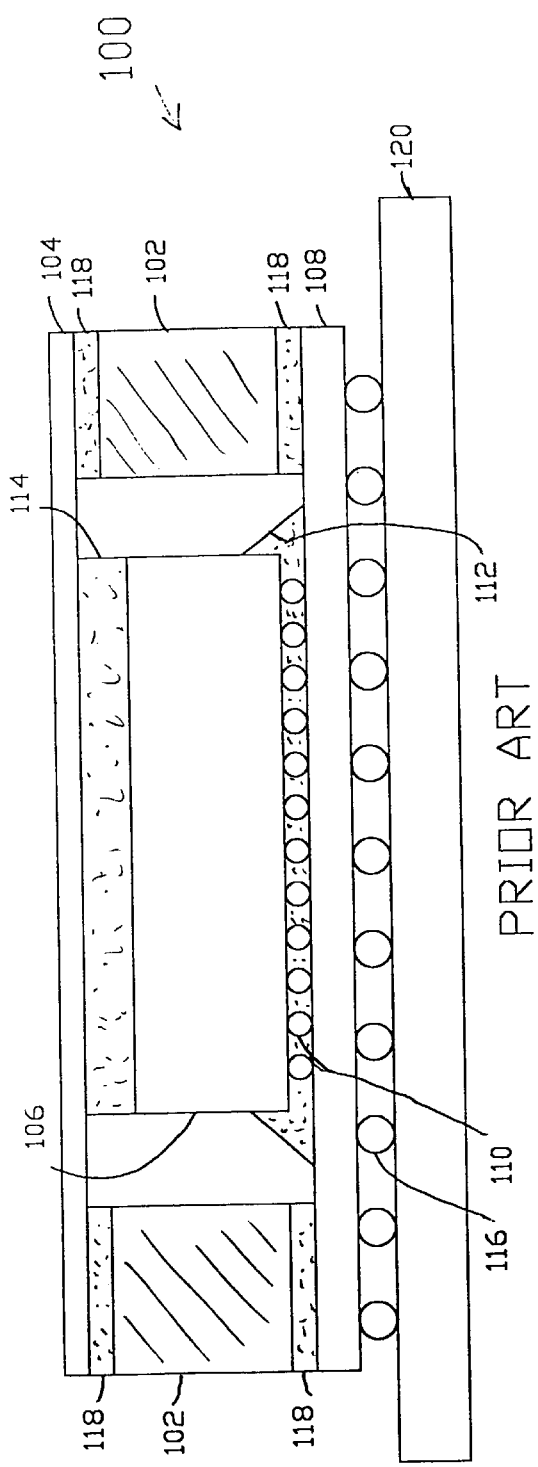
FIG. 1 is a side view diagram of a flip chip ball grid array package of the prior art.

Still referring to FIG. 2, the thin die 202 has an advantageously selected thickness of about 127 microns to about 381 microns, i.e., about one-sixth to one-half the standard thickness, for the following reasons: first, thin die 202 absorbs more stress from the interface of the stiffener adhesive 118 with the substrate 108 and consequently reduces the die-underfill shear stress, making the ball grid array package 200 more robust than that of FIG. 1; second, the thin die 202 has a smaller heat path from the outside surface to the heatspreader 104, thus improving the thermal performance of the package; third, the thin die 202 is less susceptible to flexure damage and is thus less likely to crack; and fourth, the thin die 202 has a smaller affect on the composite coefficient of thermal expansion (CTE), thus matching the coefficient of thermal expansion of the ball grid array package 200 more closely to that of the second level board 120. Matching the coefficient of thermal expansion of the ball grid array package 200 more closely to that of the second level package 120 avoids the cracking of the solder balls 116 described above as one of the disadvantages of the ball grid array package 100 in FIG. 1.

Figure 3:
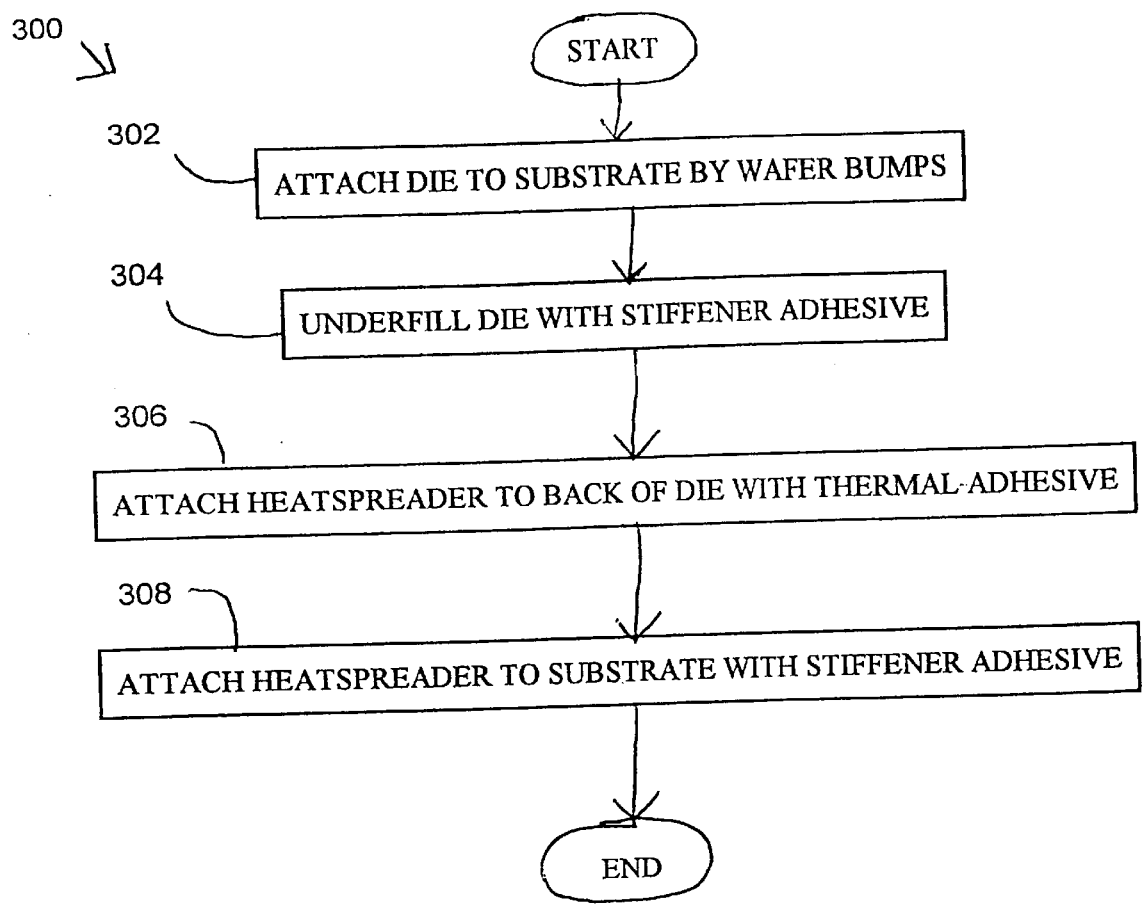
FIG. 3 is a flow chart for a method of making the flip chip ball grid array package of FIG. 2 according to another embodiment of the present invention.

FIG. 3 is a flow chart 300 for a method of making the flip chip ball grid array package of FIG. 2. At step 302, the thin die 202 is attached to the substrate 108 by the wafer bumps 110. At step 304, the thin die 202 is underfilled with the epoxy adhesive 112. At step 306, the heatspreader 104 is attached to the back of the thin die 202 with the thermal adhesive 114. At step 308, the heatspreader 104 is attached to the substrate 108 with the stiffener adhesive 118.

By eliminating the stiffeners 102 in the ball grid array package 100 of FIG. 1, the number of processing steps is correspondingly reduced, thus reducing the assembly cycle time and materials cost.

Other modifications, variations, and arrangements of the present invention may be made in accordance with the above teachings other than as specifically described to practice the invention within the scope of the following claims.

What is claimed is:

1. A flip chip ball grid array package comprising a thin die having a die thickness for matching a composite coefficient of thermal expansion to that of a second level board.

2. The flip chip ball grid array package of claim 1 wherein the die thickness is within a range from about 127 microns to about 381 microns.

3. The flip chip ball grid array package of claim 1 wherein the die is coupled to a substrate by wafer bumps.

4. The flip chip ball grid array package of claim 1 wherein the die is underfilled with an epoxy adhesive.

5. The flip chip ball grid array package of claim 1 wherein the die is coupled to a heatspreader by a thermal adhesive.

6. The flip chip ball grid array package of claim 5 wherein the heatspreader is coupled to the substrate by a stiffener adhesive.

7. The flip chip ball grid array package of claim 1 wherein the die thickness is selected for at least one of absorbing die-underfill interface stress from a substrate, increasing heat transfer from the die to a heatspreader, and avoiding flexure damage to the die.

* * * * *